United States Patent
Taraki et al.

(10) Patent No.: US 6,225,972 B1
(45) Date of Patent: May 1, 2001

(54) OSCILLOSCOPE DISPLAY WITH RAIL INDICATOR

(75) Inventors: Yosuf M. Taraki, Evanston; Dale A. Trsar, Mt. Prospect, both of IL (US)

(73) Assignee: Snap-on Tools Company, Kenosha, WI (US)

( * ) Notice: Subject to any disclaimer, the term of this patent is extended or adjusted under 35 U.S.C. 154(b) by 0 days.

(21) Appl. No.: 09/133,571

(22) Filed: Aug. 13, 1998

(51) Int. Cl.[7] .................................................. G09G 5/36
(52) U.S. Cl. ...................................... 345/134; 324/121 R
(58) Field of Search .................................... 345/134, 133; 324/121 R, 76.12, 103 R, 115

(56) References Cited

U.S. PATENT DOCUMENTS

| | | |
|---|---|---|
| 2,570,139 | 10/1951 | Maxwell . |
| 3,543,148 | 11/1970 | Martin . |
| 3,891,933 | 6/1975 | Suzuki et al. . |
| 4,238,727 | 12/1980 | Madni . |
| 4,272,719 | 6/1981 | Niki et al. . |
| 4,399,512 | 8/1983 | Soma et al. . |
| 4,611,164 | 9/1986 | Mitsuyoshi et al. . |
| 4,628,254 * | 12/1986 | Bristol ............................. 324/121 R |
| 4,761,640 * | 8/1988 | Slavin ................................... 345/134 |
| 4,763,067 * | 8/1988 | Fladstol ............................ 324/121 R |
| 4,975,633 | 12/1990 | Toda et al. . |
| 5,004,975 * | 4/1991 | Jordan .............................. 324/121 R |
| 5,025,208 | 6/1991 | Danzeisen . |
| 5,068,620 | 11/1991 | Botti et al. . |
| 5,119,018 | 6/1992 | Katayama et al. . |
| 5,365,254 | 11/1994 | Kawamoto . |
| 5,414,635 | 5/1995 | Ohta . |
| 5,430,409 | 7/1995 | Buck et al. . |
| 5,442,316 | 8/1995 | Buck et al. . |
| 5,453,716 | 9/1995 | Person et al. . |
| 5,543,779 | 8/1996 | Aspesi et al. . |
| 5,585,819 | 12/1996 | Kazui . |

\* cited by examiner

Primary Examiner—Regina Liang
(74) Attorney, Agent, or Firm—Seyfarth Shaw (57) ABSTRACT

A digital engine analyzer includes an ADC which can become railed to clip an acquired waveform signal. The analyzer has a waveform display system which displays an indication of the rail level and the fact that a displayed waveform representation is clipped at the rail level. In one embodiment the rail level is displayed as a red line and the clipped portion of the waveform is displayed as a flat line substantially at the rail level. In another embodiment, the clipped portion of the waveform representation is displayed in red as a horizontal line at the rail level while the remainder of the waveform representation is displayed in green, and the rail level is otherwise not displayed.

20 Claims, 7 Drawing Sheets

OSCILLOSCOPE DISPLAY WITH RAIL INDICATOR

BACKGROUND OF THE INVENTION

The present invention relates generally to waveform display systems and, in particular, to automotive engine analyzers including such display systems.

Digital engine analyzers having digital oscilloscope display screens are well known, one such analyzer and the waveform display system therefor being disclosed in copending U.S. application Ser. No. 08/629,484, filed Apr. 10, 1996, and entitled "System for Reconfiguring Oscilloscope Screen in Freeze Mode", the disclosure of which is incorporated herein by reference. Under some circumstances, a signal displayed on the oscilloscope screen of such an analyzer can be clipped or otherwise altered due to rails in the oscilloscope circuitry, resulting in a misleading waveform display. For example, the engine analyzer disclosed in the aforementioned application includes an analog-to-digital converter ("ADC") which has rails, i.e., the voltages at which the ADC reaches its full negative or positive count. Any acquired waveform voltage exceeding the rail voltage level will cause no further change in the output of the ADC. When this occurs, it is said that the ADC is "railed" and that the acquired waveform is clipped at the rail level. It is sometimes possible for the operator to view a waveform display which is clipped in this manner, without being aware that the waveform is clipped. This may be particularly true in the case of some waveforms, such as square waves, wherein it is difficult to determine whether or not the waveform is clipped.

Figure 2:
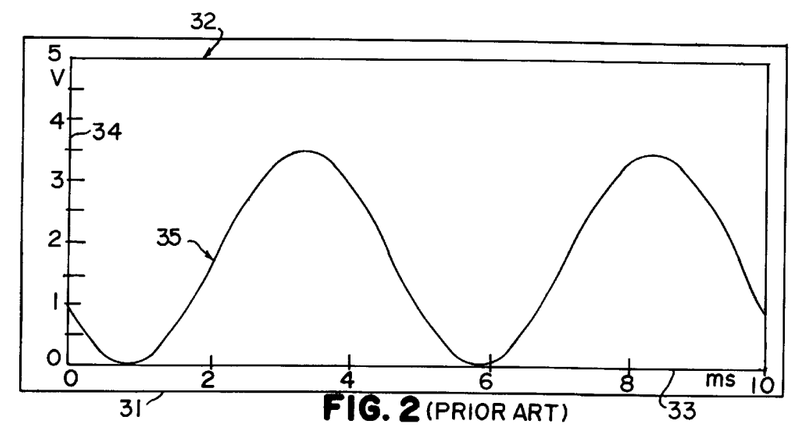
FIGS. 2–5 are waveform diagrams illustrating waveform representations as displayed on the system of FIG. 1, with FIGS. 4 and 5 illustrating limit level indications in accordance with a first embodiment of the present invention.
Figure 3:
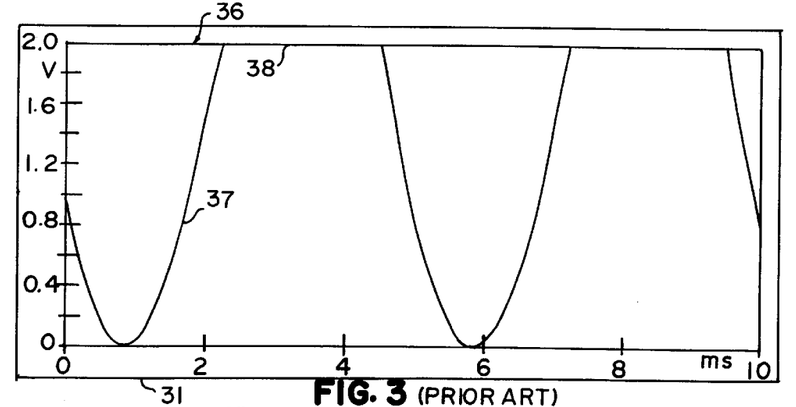
Figure 4:
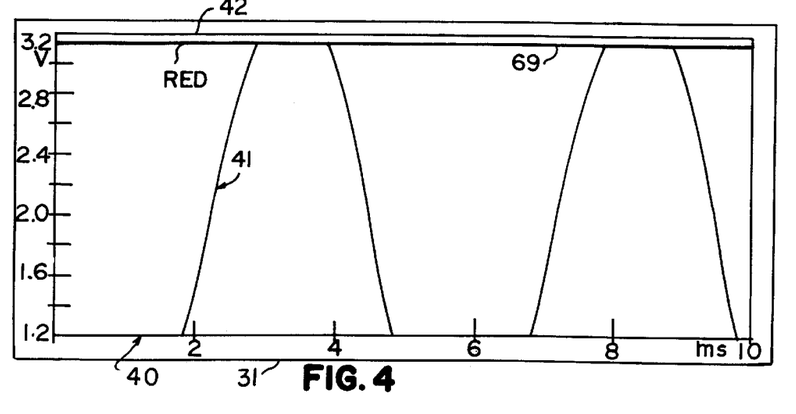

This can be illustrated in FIGS. 2–5. FIG. 2 shows a zero to 3.5-volt sine wave acquired and plotted on a 5-volt scale. In the engine analyzer of the aforementioned application, the 5-volt scale uses a hardware channel which has a range of almost 32 volts, i.e., the ADC reaches its maximum count when the acquired incoming signal is close to 32 volts. FIG. 2 shows the same waveform acquired and plotted on a 2-volt scale. This scale uses a hardware channel which has a much smaller range of about 3.2 volts. Thus, as can be seen in FIG. 3, the 3.5-volt sine wave extends beyond the plot area on a 2-volt scale. FIG. 4 shows the same signal on a 2-volt scale with a 1.2-volt offset (i.e., the scale extends from 1.2 volts to 3.2 volts). As can be seen, the top of the waveform is clipped as it bumps up against the 3.2-volt rail level of the ADC. Since this rail level is at the top of the scale, it would be very difficult for an operator to determine whether the top of the waveform is removed simply because it is extending beyond the scale (as in FIG. 3) or because it is being clipped by encountering a rail level in the oscilloscope circuitry.

Figure 5:
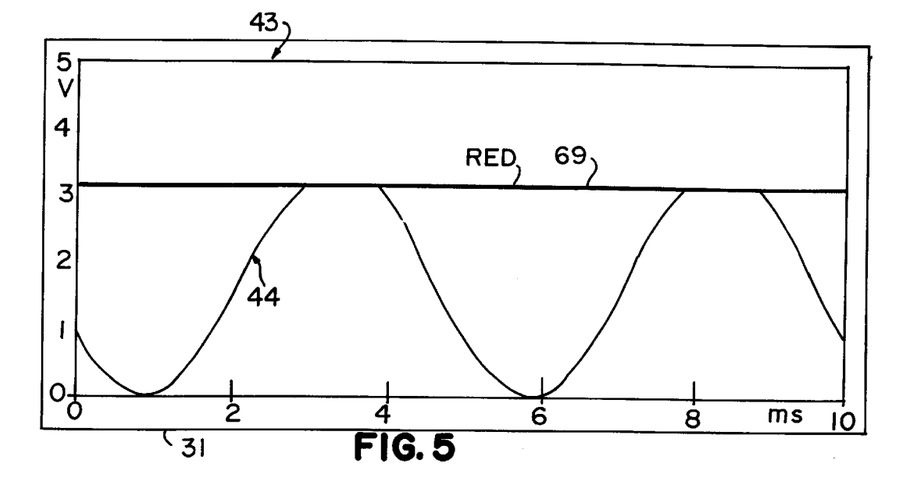

Also, engine analyzers of the type described in the aforementioned application have the capability of operating in a freeze mode, wherein a currently acquired and displayed waveform can be frozen on the screen. This analyzer is also capable of changing the display format in the freeze mode. FIG. 5 illustrates the waveform of FIG. 3 after the screen has been frozen and the display scale switched to the 5-volt scale. Since the waveform data was captured in the 2-volt scale (which has a 3.2-volt rail), switching to the 5-volt scale in freeze mode does not extend the range of the scale, as it would in live mode (FIG. 2). Thus, the waveform in FIG. 5 is clipped at the 3.2-volt rail level. While this is fairly apparent with the sine waveform of FIG. 5, it might be very difficult to determine with another waveform, such as a square wave.

SUMMARY OF THE INVENTION

It is a general object of the invention to provide an improved waveform display system which avoids the disadvantages of prior systems while affording additional structural and operating advantages.

An important feature of the invention is the provision of a waveform display system which provides an indication that a displayed waveform representation may be distorted or otherwise altered by internal circuitry of the display system.

In connection with the foregoing feature, another feature of the invention is the provision of a system of the type set forth, which, when a limit level imposed by the system circuitry is encountered by an acquired waveform signal, provides an indication of both the limit level and the fact that a displayed waveform representation may be altered by the limit level.

A still further feature of the invention is the provision of a system of the type set forth, which is of relatively simple and economical construction and permits a user to readily determine the existence and effect of rail levels encountered by an acquired waveform signal in the display system circuitry.

Certain ones of these and other features of the invention are attained by providing, in a waveform display system including a display screen, acquisition circuitry for acquiring a waveform signal and display control circuitry coupled to the acquisition circuitry and to the display screen for controlling the display on the screen of a waveform representation of the acquired waveform signal, the improvement comprising: a processor in the display control circuitry operating under stored program control and executing a program routine including: a first portion identifying a limit level for the waveform representation and determining whether an acquired waveform signal encounters the limit level, and a second portion controlling display on the screen of an indication of the limit level and/or an indication that the displayed waveform representation may be altered by the limit level.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

DESCRIPTION OF THE PREFERRED EMBODIMENTS

Figure 1:
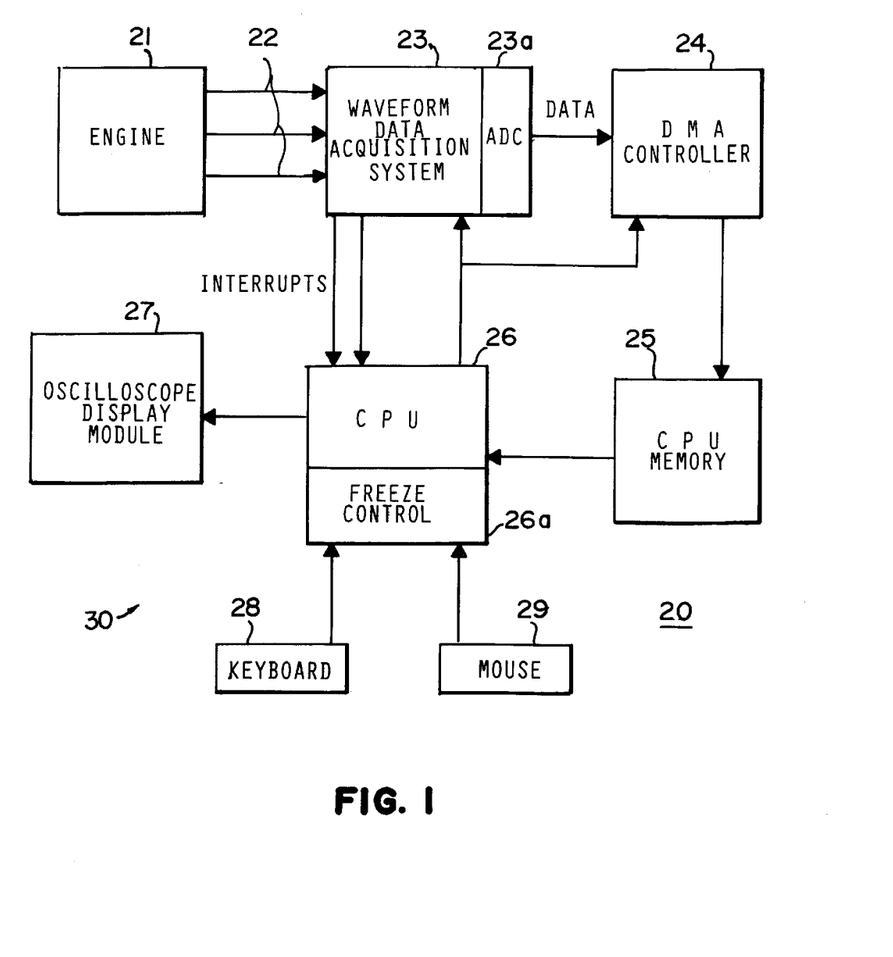
FIG. 1 is a functional block diagrammatic view of an engine analyzer system incorporating a waveform display system in accordance with the present invention.

Referring to FIG. 1, there is illustrated an engine analyzer 20 including display control circuitry 30 in accordance with the present invention. The engine analyzer 20 is generally of the type disclosed in the aforementioned U.S. application Ser. No. 08/629,484, and is designed for analyzing operation of an automotive internal combustion engine 21. More specifically, the analyzer 20 has a plurality of pickup leads 22 adapted to be connected to associated points in the engine 21 for acquiring signals to be analyzed. The pickup leads 22 are coupled to a waveform data acquisition system 23 for processing the acquired analog signals, the data acquisition system 23 including an analog-to-digital converter ("ADC") 23a. The digitized data is applied through a DMA controller 24 to a CPU memory 25 before storage, the memory being associated with a central processing unit ("CPU") 26, which typically includes a microprocessor, and includes a freeze control section 26a.

The CPU 26 is coupled to the waveform data acquisition system 23 and to the DMA controller 24 for controlling operation thereof and for receiving from the acquisition system 23 appropriate interrupts, in a known manner. The CPU 26 is coupled to a an oscilloscope display module 27, which includes a display screen 31 (FIG. 2) for displaying waveform and other data, either acquired from the engine 21 or generated by the system 20. Preferably, the display module 26 is in the nature of a digital point-addressable display which can function as an oscilloscope. The CPU 26 is also preferably coupled to other associated user interface devices, such as a keyboard 28 and/or a mouse 29, for operation in a known manner to selectively control predetermined operations of the analyzer 20. The display control circuitry 30 incorporates the CPU 26 and its associated memory 25 and the circuitry associated with the display module 27.

Referring now also to FIG. 2, the display screen 31 can be used, e.g., to display waveform representations of acquired waveform signals. For this purpose, the display control circuitry 30 will generate and display on the screen 31 a waveform plot area 32, which will typically have a horizontal axis, such as a time axis 33, and a vertical axis, such as a voltage axis 34. In the screen display of FIG. 2, the plot area 32 has a 5 VDC scale, with the vertical axis extending from 0 to 5 volts. For simplicity, there is shown a waveform representation 35 in the nature of a sine wave, representing a signal acquired from the engine 21, although it will be appreciated that a signal actually acquired from an engine would typically have some other form. In this case, the sine wave signal has a peak-to-peak amplitude of 3.5 volts and, therefore, its entire amplitude can be plotted on the 5-volt scale of the plot area 32. In this particular analyzer, the 5-volt scale uses a hardware channel which has a range of almost 32 volts (i.e., the ADC 23a reaches its maximum count when the signal is close to 32 volts).

FIG. 3 shows the same waveform signal acquired and plotted on a plot area 36 with a 2-volt scale, the hardware channel for which has a much smaller range of about 3.2 volts. Thus, the plotted waveform representation 37 extends beyond the upper edge 38 of the plot area 36, so that the upper peaks of the waveform signal cannot be seen.

FIG. 4. shows a plot area 40 which also has a 2-volt scale, but shifted with a 1.2-volt offset, so that the scale extends from 1.2 volts to 3.2 volts. In this case, the top of the waveform representation 41 is cut off by the rail of the ADC 23a, which is substantially at the upper edge 42 of the plot area 40. Thus, without the present invention, the operator would not know whether the waveform representation 41 is being clipped because it extends beyond the upper edge of the plot area 42 or because it is encountering a rail in the circuitry of the analyzer 20. As was indicated above, FIG. 5 illustrates the situation where the display of FIG. 4 has been frozen, and the frozen display has been shifted to a plot area 43 with a 5-volt scale, resulting in a waveform representation 44 which, again, is clipped at the rail level of the ADC 23a.

Figure 6:
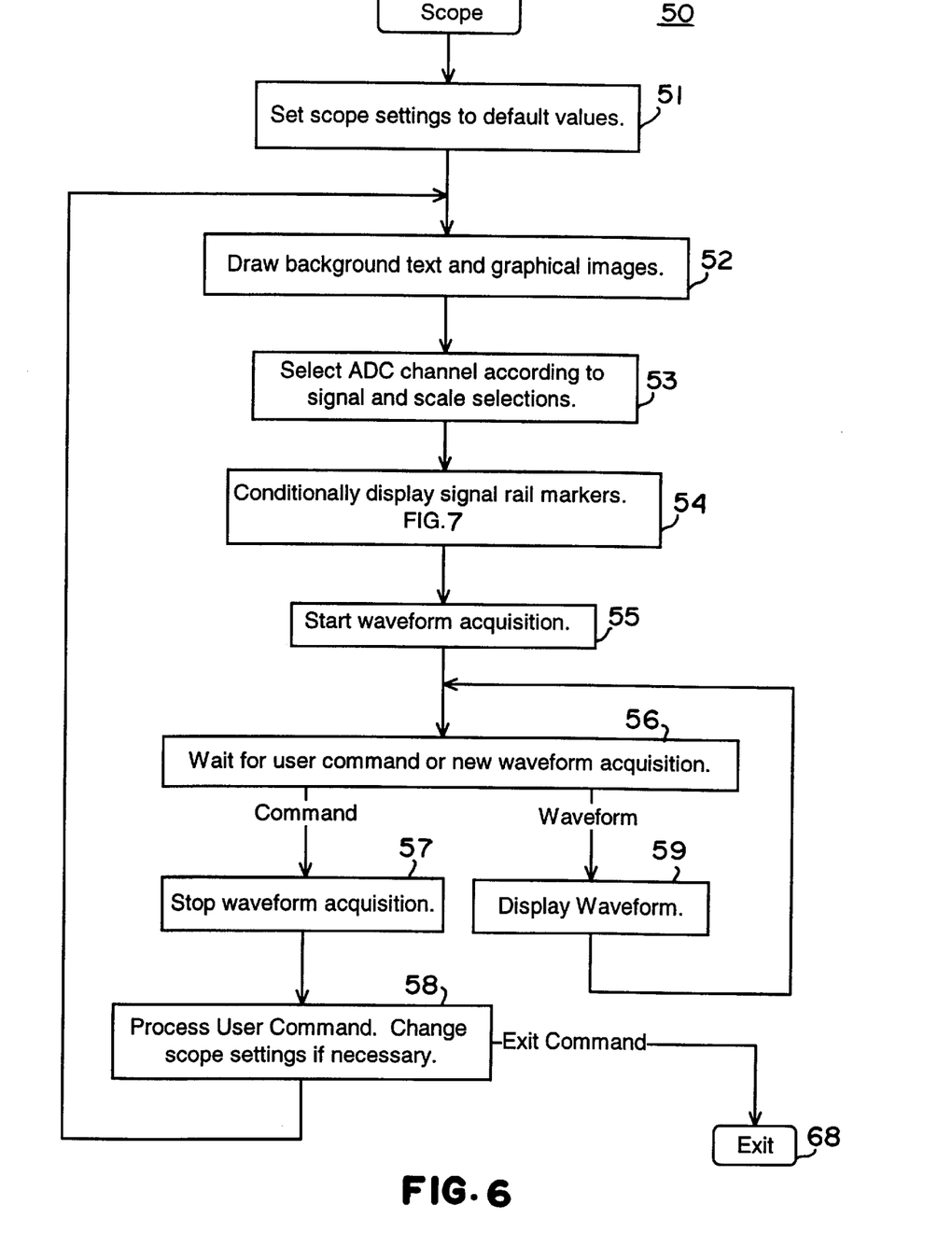
FIGS. 6 and 7 are software flow chart diagrams of the program for controlling the operation of the invention in accordance with FIGS. 4 and 5.
Figure 7:
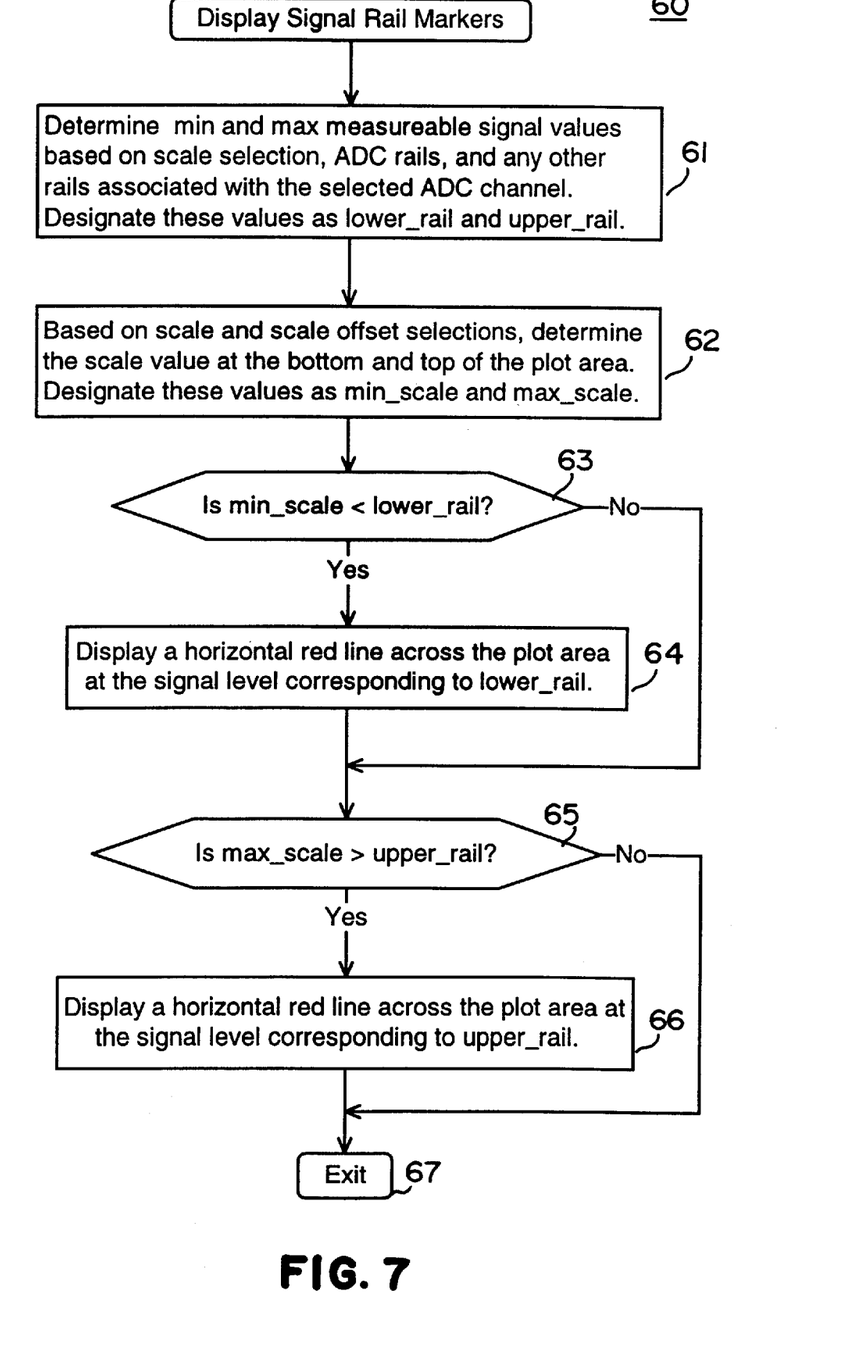

Referring to FIGS. 6 and 7, it is a significant aspect of the present invention that the CPU 26 executes a program routine 50 for indicating to the operator that the waveform display representation has encountered a rail in the system circuitry. More specifically, in the routine 50, the system sets the scope settings to default values at 51 and then, at 52, draws the background text and graphical images of the plot area on the display screen 31. Then, at 53, the routine selects an ADC channel according to the acquired signal and display scale selections and, based upon these selections, conditionally displays signal rail markers at 54 by use of a subroutine 60, illustrated in FIG. 7. Then, at 55, the routine starts a waveform acquisition by the waveform data acquisition system 23 and then, at 56, waits for a user command or a new waveform acquisition. If a user command is encountered, such as through the keyboard 28 or the mouse 29, then the routine at 57 stops waveform acquisition and then, at 58, processes the user command, changes the scope settings if necessary, and returns to 52. If, at 56, the system encounters an acquired waveform, then, at 59, it proceeds to display the waveform in the plot area and returns to 56 to wait for the next user command or waveform acquisition.

Referring to FIG. 7, the subroutine 60 for conditional display of the signal rail markers (called at 54 of FIG. 6) initially proceeds at 61 to determine the minimum and maximum measurable signal values, based on the scale selection, ADC rails, or any other rails associated with the selected ADC channel. Then it designates these values as lower_rail and upper_rail. Then, at 62, based on scale and scale offset selections, the subroutine determines the scale values at the bottom and at the top of the plot area and designates these values, respectively, as min_scale and max_scale. Next, at 63, the subroutine checks to see if min_scale is less than lower_rail, i.e., whether the bottom edge of the plot area is below the lower rail level of the circuitry. If it is, the subroutine proceeds at 64 to display a horizontal red line (69 in FIGS. 4 and 5) across the plot area at the signal level corresponding to lower_rail, and then proceeds to 65. If not, the routine proceeds directly from 63 to 65. At 65, the subroutine checks to see if max_scale is greater than upper_rail, i.e., whether or not the upper rail level is within the plot area. If it is, the subroutine, at 66, displays the horizontal red line across the plot area at the signal level corresponding to upper_rail and then exits the subroutine at 67. Otherwise, the system exits directly from 65, returning to 55 in the main routine 50 (FIG. 6). If, at 58 of the main routine 50, the user command encountered is an exit command, the routine is exited immediately at 68.

Summarizing, this embodiment of the present invention determines the maximum and minimum signal values which can be measured by the analyzer circuitry, designates them as rail levels and, if they fall within the display plot area, draws a horizontal red line at the rail level, whether or not the acquired waveform signal encounters the rail. Any portion of the waveform representation clipped by the rail is displayed simply as a flat horizontal line at the rail level, resulting in display of an altered waveform representation.

While FIGS. 4 and 5 illustrate only an upper rail red line, it will be appreciated that if a lower rail were encountered a similar red line would be displayed at that level.

Preferably, the flat line designating a clipped portion of the waveform is drawn a pixel above or below the rail level so as not to obscure the rail level line itself.

Figure 9:
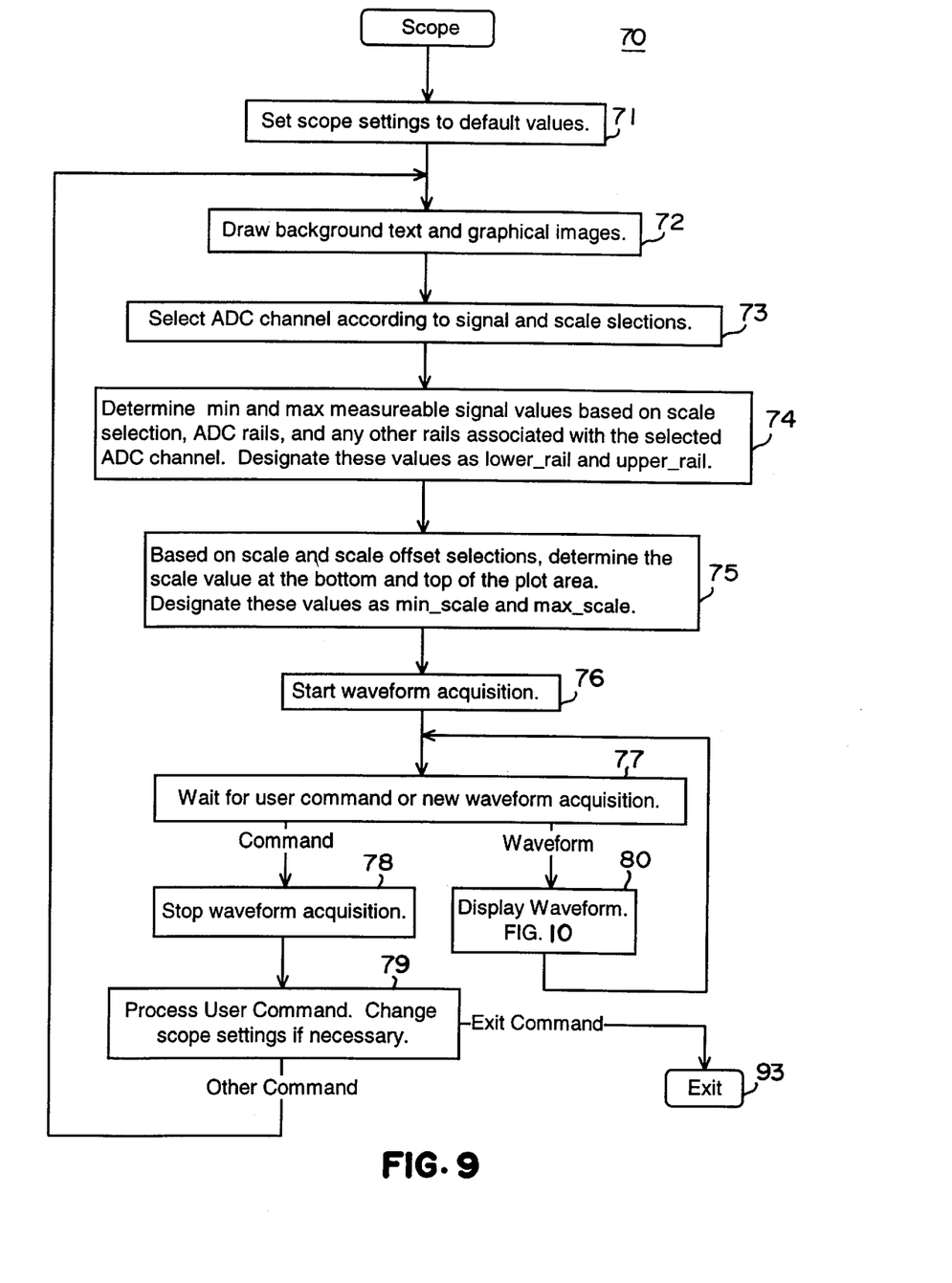
FIGS. 9 and 10 are software flow chart diagrams of the program for controlling the operation of the invention in accordance with FIG. 8.
Figure 10:
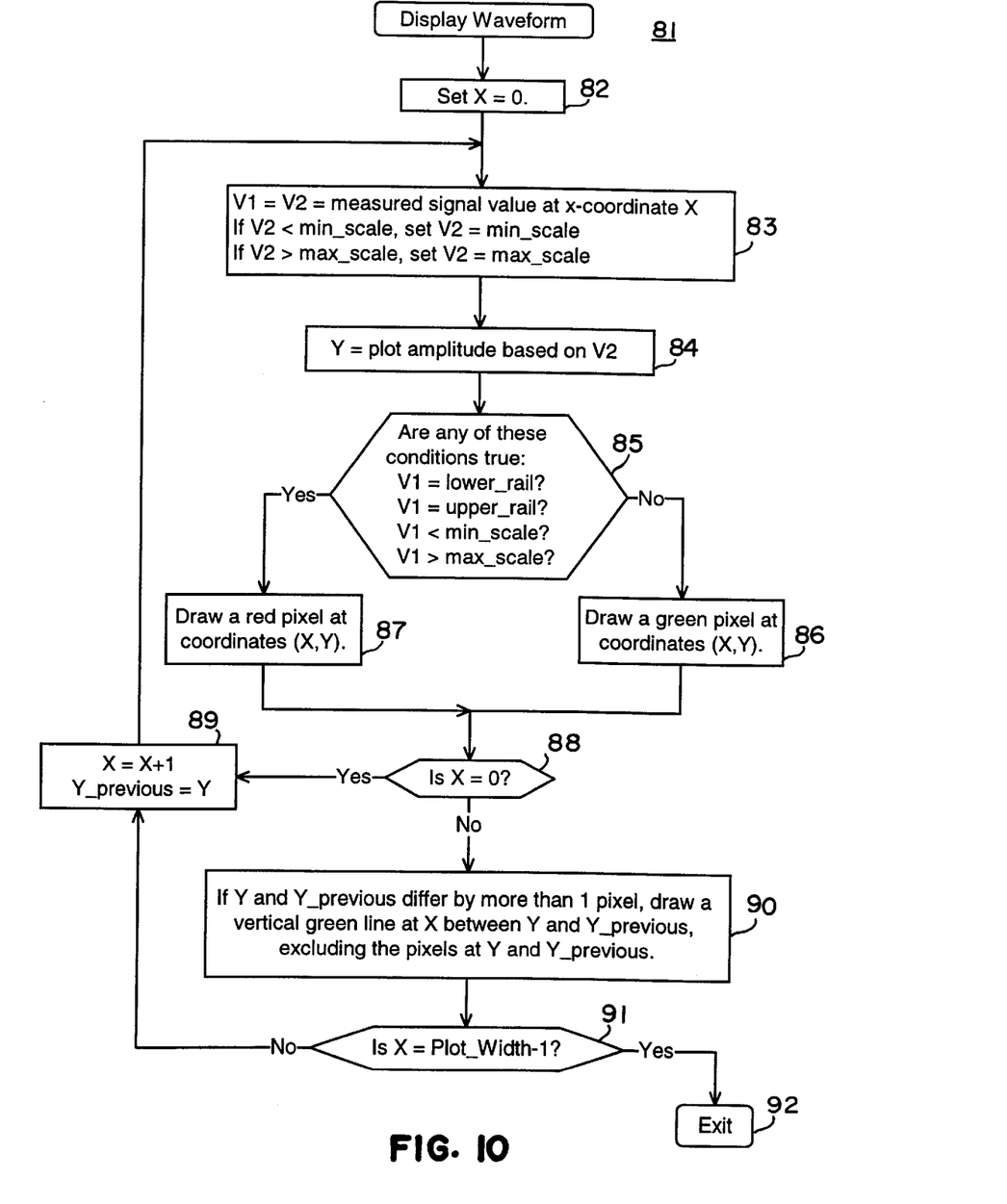

Referring now to FIGS. 9 and 10, there is illustrated an alternative program routine executed by the CPU 26 for providing an alternative indication of the rail level and the alteration of the displayed waveform representation thereby. More specifically, in the routine 70 of FIG. 9, the program first, at 71, sets the scope settings to the default values and then, at 72, draws the background text and graphical images of the plot area. Next, at 73, the routine selects the ADC channel according to signal and scale selections and then, at 74, determines the minimum and maximum measurable signal values based on the scale selection, the ADC rails and any other rails associated with the selected ADC channel, then designates these values, respectively, as lower_rail and upper_rail. Then, at 75, based on the scale and scale offset selections, the routine determines the scale values at the bottom and top of the plot area and designates these values, respectively, as min_scale and max_scale and then, at 76, starts waveform acquisition and, at 77, waits for a user command or a new waveform acquisition. If a user command is encountered, the routine, at 78, stops the waveform acquisition and then, at 79, processes the user command, changes the scope settings if necessary, and returns to 72. If, at 77, a waveform acquisition is encountered, the routine, at 80, displays the waveform in accordance with the subroutine of FIG. 10, and then returns to 77.

Referring to FIG. 10, there is illustrated the subroutine 81 for displaying the waveform at 80 of FIG. 9. This subroutine, at 82, first sets the X axis value at zero and then, at 83, assigns V1=V2=the measured signal value at the x-coordinate X. If V2 is less than min_scale, it sets V2=min_scale and, if V2 is greater than max_scale, it sets V2=max_scale. Then, at 84, the routine sets Y=the plot amplitude based on V2. Then, at 85, the subroutine checks to see if any of the following conditions are true:

V1=lower_rail?
V1=upper_rail?
V1<min_scale?
V1>max_scale?

It will be appreciated that V1=lower_rail if the acquired signal level is at or below the lower rail level and V1=upper_rail if the acquired signal level is at or above the upper rail level since, by definition, V1 cannot be beyond the rail level imposed by the measuring circuitry. If none of these conditions is true, the subroutine, at 86, draws a green pixel in the plot area at the coordinates (X, Y). If any of the conditions at 85 is true, the subroutine, at 87, draws a red pixel at the coordinates (X, Y). Next, at 88, the subroutine asks if X=zero. If it is, it sets X=X+1 and sets Y_previous =Y and then returns to 83 to check the next actually measured signal value. If, at 88, X is not equal to zero, the routine proceeds to 90 and, if Y and Y_previous differ by more than one pixel, draws a vertical green line at the coordinate X between Y and Y_previous, excluding the pixels at Y and Y_previous. Then, at 91, it checks to see if X =Plot_With−1, i.e., whether the next value will be at the right-hand edge of the plot area. If not, the routine again increments the X coordinate and sets Y___previous equal to Y at 89, and again returns to 83. If so, the routine exists at 92. If, at 79 in the routine 70 of FIG. 9, the encountered user command is an exit command, the routine exits immediately at 93.

Figure 8:
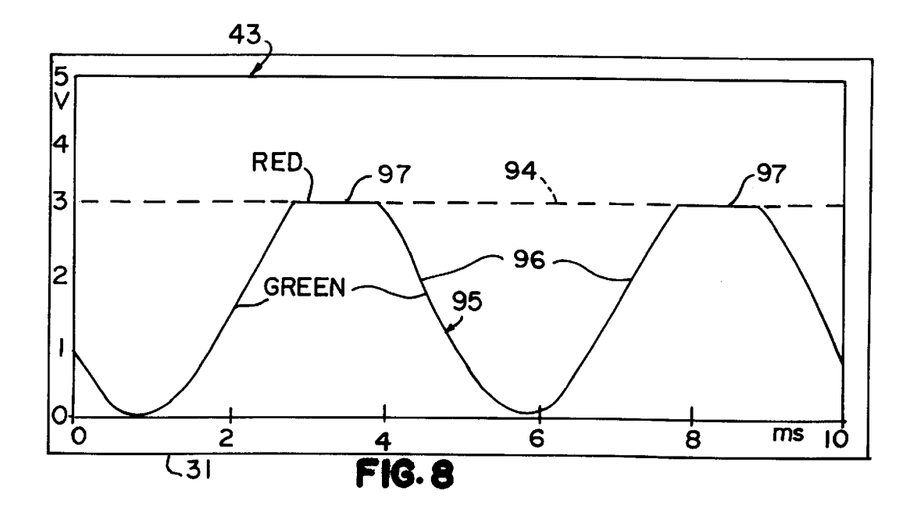
FIG. 8 is a waveform diagram similar to FIG. 5 illustrating a second embodiment of the invention.

Summarizing, in this embodiment of the invention, if the system determines that an acquired and measured signal value falls within the plot area and between rail levels it will plot the value at the appropriate coordinates as a green pixel. If, on the other hand, the acquired and measured signal value is either at a rail level or beyond the top or bottom edge of the plot area, the value is plotted as a red pixel. If the pixel is red because the signal value is beyond an edge of the plot area it is plotted at that edge. Thus, by way of illustration, referring to FIG. 8, the waveform representation 95 is a sine wave, the upper peaks of which are railed at a rail level 94. Accordingly, those portions of the waveform representation 95 below the rail level are plotted in green, as at 96, while those at or above the rail level 94 are plotted in red as a horizontal line at the rail level, as at 97. In this embodiment, the rail level per se is not plotted, but is indicated by the level at which clipping of the waveform occurs.

While, in the above-described embodiments, the rail levels are set by the ADC 23a, it will be appreciated that signals could be railed by other portions of the circuitry of the engine analyzer 20. Whatever the source of the rail level, the present invention will either display the rail level as a red horizontal line or display the portions of the waveform representation at or above an upper rail level and at or below a lower rail level as a flat line at the rail level in a different color.

From the foregoing, it can be seen that there has been provided an improved waveform display system which permits the user to determine that a displayed waveform representation has been altered by a rail level encountered in the system's circuitry, and also to ascertain the rail level at which the alteration occurs.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. In a waveform display system including a display screen, acquisition circuitry for acquiring a waveform signal and display control circuitry coupled to the acquisition circuitry and to the display screen for controlling the display on the screen of a waveform representation of the acquired waveform signal, the improvement comprising:
   a processor in said display control circuitry operating under stored program control and, executing a program routine including:
      a first portion identifying a limit level for the waveform representation beyond which a representation of the waveform signal cannot be displayed and determining whether an acquired waveform signal encounters the limit level, and
      a second portion controlling display on the screen of an indication of the value of the limit level and/or an indication that the displayed waveform representation may be altered by encountering the limit level.

2. The system of claim 1, wherein the display screen is an oscilloscope screen.

3. The system of claim 2, wherein the display screen is a digital oscilloscope screen.

4. The system of claim 1, wherein the second portion includes a sub-portion for drawing a line on the screen at the limit level.

5. The system of claim 4, wherein the line is displayed in a different color from that of the waveform representation.

6. The system of claim 4, wherein a portion of the acquired waveform signal that extends beyond the limit level is displayed as a flat line substantially at the limit level.

7. The system of claim 1, wherein a portion of the acquired waveform signal that encounters the limit level is displayed as a flat line substantially at the limit level, but the limit level is otherwise not displayed.

8. The system of claim 7, wherein the portion of the waveform representation substantially at the limit level is displayed differently from the remainder of the waveform representation.

9. The system of claim 8, wherein the portion of the waveform representation substantially at the limit level is displayed in a different color from the remainder of the waveform representation.

10. In a waveform display system including a display screen and having circuitry which defines a rail level which can clip an acquired waveform signal so that a representation of the waveform signal cannot be displayed beyond the rail level, causing display of an altered representation of the waveform signal, the improvement comprising:

a processor operating under stored program control and executing a program routine including:
 a first portion identifying the rail level and determining whether an acquired waveform signal encounters the rail level, and
 a second portion controlling display on the screen of an indication of the value of the rail level and/or an indication that the displayed waveform representation may be clipped at the rail level.

11. The system of claim 10, wherein the display screen is an oscilloscope screen.

12. The system of claim 10, wherein said circuitry includes an analog-to-digital converter which defines the rail level.

13. The system of claim 10, wherein the second portion includes a sub-portion for drawing a line on the screen at the rail level.

14. The system of claim 13, wherein the line is displayed in a different color from that of the waveform representation.

15. The system of claim 13, wherein a portion of the acquired waveform signal that extends beyond the rail level is displayed as a flat line substantially at the rail level.

16. The system of claim 10, wherein a portion of the acquired waveform signal that encounters the rail level is displayed as a flat line substantially at the rail level, but the rail level is otherwise not displayed.

17. The system of claim 16, wherein the portion of the waveform representation substantially at the rail level is displayed differently from the remainder of the waveform representation.

18. The system of claim 17, wherein the portion of the waveform representation substantially at the rail level is displayed in a different color from the remainder of the waveform representation.

19. In a waveform display system including a display screen, acquisition circuitry for acquiring a waveform signal and display control circuitry coupled to the acquisition circuitry and to the display screen for controlling the display on the screen of a waveform representation of the acquired waveform signal, the improvement comprising:

a processor in said display control circuitry operating under stored program control, said processor including means identifying a limit level for the waveform representation beyond which a representation of the waveform signal cannot be displayed and determining whether an acquired waveform signal encounters the limit, and means controlling display on the screen of an indication of the value of the limit level and/or an indication that the displayed waveform representation may be altered by encountering the limit level.

20. In a waveform display system including a display screen and having circuitry which defines a rail level which can clip an acquired waveform signal so that a representation of the waveform signal cannot be displayed beyond the rail level, causing display of an altered representation of the waveform signal, the improvement comprising:

a processor operating under stored program control, said processor including means identifying the rail level and determining whether an acquired waveform signal encounters the rail level, and means controlling display on the screen of an indication of the value of the rail level and\or an indication that the displayed waveform representation may be clipped at the rail level.

* * * * *